United States Patent [19]

Levy et al.

[11] 4,078,492

[45] Mar. 14, 1978

[54] MAKING A DECORATIVE STAINED GLASS EFFECT WINDOW SHADE

[75] Inventors: Alan D. Levy; Mark A. Seltman, both of Pittsburgh, Pa.

[73] Assignee: Alan D. Levy, Pittsburgh, Pa.

[21] Appl. No.: 512,123

[22] Filed: Oct. 4, 1974

[51] Int. Cl.$^2$ .......................... A47G 5/02; B41M 3/00; G03F 1/02

[52] U.S. Cl. .................................. 101/426; 101/128.3; 101/211; 101/467; 160/238; 160/264

[58] Field of Search ................ 160/238, 264; 101/426, 101/129, 128.3, 211, 467

[56] References Cited

U.S. PATENT DOCUMENTS

| | | | |
|---|---|---|---|
| 1,374,853 | 4/1921 | John | 96/33 |
| 1,376,652 | 5/1921 | Steedman | 101/32 |
| 1,588,574 | 6/1926 | Gestetner | 101/128.3 |
| 2,143,382 | 1/1939 | Martens | 160/264 |
| 3,186,473 | 6/1965 | Myers et al. | 160/241 |
| 3,186,474 | 6/1965 | Levitas | 160/238 |
| 3,205,118 | 9/1965 | Guffan | 160/238 X |
| 3,246,598 | 4/1966 | Satonick | 101/128.3 |
| 3,308,872 | 3/1967 | Smith | 160/120 |
| 3,466,776 | 9/1969 | Paige | 160/238 X |

*Primary Examiner*—Clyde I. Coughenour
*Attorney, Agent, or Firm*—Buell, Blenko & Ziesenheim

[57] ABSTRACT

A decorative stained glass effect window shade in the form of a light transparent elongated plastic film adapted to cover a window opening and having thereon a colored reproduction of an actual stained glass window assembly and produced by photographing a stained glass window on a positive transparency film, transferring the photograph from the transparency to an ink reproducing member and reproducing the transparency onto a transparent plastic film in light transmitting colored inks.

5 Claims, 2 Drawing Figures

Fig. 1.
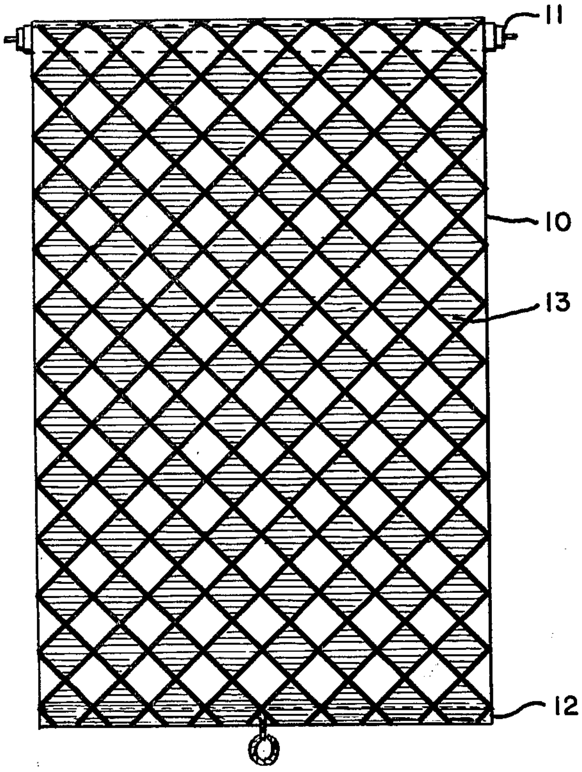
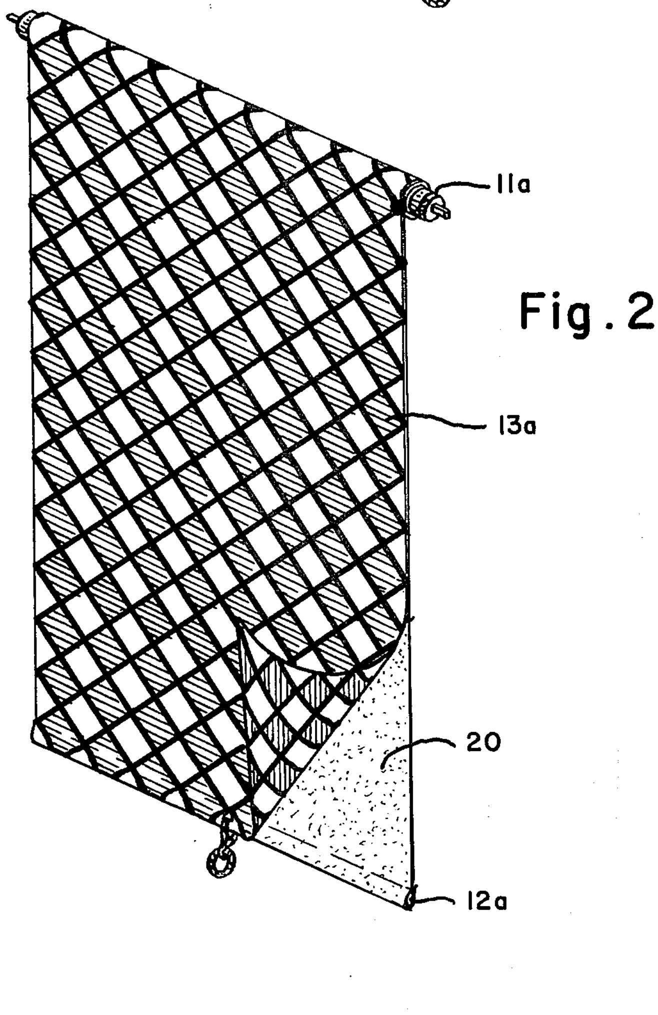
Fig. 2.

MAKING A DECORATIVE STAINED GLASS EFFECT WINDOW SHADE

The present invention relates to decorative stained glass effect window shades and method of making the same and particularly to a light transmitting window shade which provides the beauty of an actual stained glass window with privacy and a photographic process to provide the same.

The use of window shades to provide privacy in homes is old and well known. Conventionally, window shades are made up of a spring loaded roller to which is attached a light controlling sheet designed to prevent or at least substantially control light transmission therethrough. Such conventional window shades are a relatively inexpensive and utilitarian solution to the control of window light transmission and to the problem of providing privacy in dwellings. Unfortunately, window shades have been generally drab and unattractive and, while quite functional, they have not been particularly attractive.

There have been attempts to improve the attractiveness of window shades in the past. For example, Guffan U.S. Pat. Nos. 3,205,118 and 3,582,441 describe proposed solutions to the problem. However, these proposed solutions while somewhat decorative do not provide the kind of light control and decorative effect which is essential to most homes. The Guffan patents provide either a decorative overlay to be applied over the entire surface of a non-transparent base sheet (U.S. Pat. No. 3,205,118) which prevents substantially all light transmission or a trim to be applied to conventional non-transparent window shade (U.S. Pat. No. 3,582,441).

We have developed a window shade and method of making the same which provides a combination of light transmission and light control with the colors and designs of real stained glass windows so that one can have the color, beauty, and light transmission of stained glass with the necessary privacy. In short, we provide a decorative stained glass effect window shade which not only serves the utilitarian purposes of providing privacy and protection against sunshine but also provides for beautifying the rooms in which they are used. The window shades of our invention may have an infinite variety of patterns and color schemes limited only by the colors of available stained glass and the imagination of the artist.

The window shades of the present invention provide an inexpensive means for decorating a window without requiring complicated construction or reconstruction of the window and without the use of special tools or special skills. They provide the effect achieved by a stained glass window without the high cost and without the talent and skill required for installation of an actual stained glass window.

In our invention, we provide a window shade which comprises an elongated light transparent plastic film or sheet, attached at one end to a spring loaded roller and a colored reproduction of an actual stained glass assembly on one surface of said film or sheet. The film or sheet may be embossed or laminated with an embossed or frosted film or layer to achieve the desired privacy. The base film or sheet may be of any material which will provide the necessary printability and ultra violet light stability coupled with the ability to lay flat when extended and to roll on a spring loaded roller. Among the materials which we may use are vinyl plastics such as polyvinyl chloride and vinylchloride, vinylidene chloride copolymers, polyesters such as mylar, cellulose acetate, cellulose acetate butyrate, cellulose triacetate and cellulose propionate and other like materials. The stained glass effect is produced by photographing actual stained glass artwork with proper lighting to bring out the dimensionality and irregularity of the leaded glass pattern, (see "Your Guide to Photography", 2nd Ed., Helen Finn Bruce, Barnes and Noble, pages 244 et seq.) using photographically sensitive positive transparency film (also known as color reversal film, "Photographers Handbook", Life Library of Photography, p. 16, and "Your Guide to Photography" supra, p. 80) and then reproducing the resultant photograph by printing rollers, plates or screens onto the base film. Some of the suitable methods of reproducing the photographs are rotogravure, flexograph, offset (both sheet fed and web), letterpress and silkscreening (rotary and flat bed).

In the foregoing general description of our invention, we have set out certain objects, purposes and advantages of this invention. Other objects, purposes and advantages of our invention will be apparent from a consideration of the following description and the accompanying drawings in which:

FIG. 1 is a plan view of a window shade according to our invention; and

FIG. 2 is a perspective view of a second embodiment of a window shade of this invention embodying a frosted film layer.

Referring to the drawings, we have illustrated a window shade according to this invention made up of a polyvinylchloride sheet or film 10 attached at one end to a spring loaded roller 11 and provided with a heat sealed hem 12 at the opposite end. A stained glass reproduction 13 is printed onto the surface of sheet 10 with translucent ink. When hung in a window, light passes through the sheet 10 and translucent ink of the stained glass reproduction to give the effect of a true stained glass window.

In FIG. 2, we have illustrated a window shade as in FIG. 1 with like parts carrying like numbers with the suffix *a*. Behind the film **10*a* is a second film 20** in the form of a frosted film of polyvinylchloride.

The window shade of the invention may be prepared by first making an actual glass window, photographing the window on a full size positive transparency film preparing a printing roller from said transparency and printing the window reproduction in a colored ink on a transparent plastic film.

While we have set out certain preferred embodiments and practices of our invention in the foregoing specification, it will be understood that this invention may be otherwise embodied within the scope of the following claims.

We claim:

1. The process of producing a decorative stained glass effect window shade comprising the steps of:
   (a) Providing a stained glass window in a selected pattern of colored glass segments,
   (b) Photographing at least a part of the stained glass window under lighting conditions which bring out its dimensionality and surface irregularity using positive transparency film,
   (c) Developing the positive transparency film to produce an image of said stained glass window, (d) Reproducing the image of the postive transparency film on an ink applying printing member, and (e) Causing the printing member to apply a correspondingly colored image onto a single transparent sheet of plastic film using light transmitting colored inks.

2. The process of claim 1 wherein the printing member is a silk screen.

3. The process of claim 1 wherein the printing member is a printing roll.

4. The process of claim 1 wherein the printing member is a printing plate.

5. The process of producing a decorative stained glass effect window shade according to claim 1, comprising the additional steps of (a) Providing a shade roller member, and (b) Attaching the single sheet of plastic film to the shade roller member.

* * * * *

UNITED STATES PATENT OFFICE

CERTIFICATE OF CORRECTION

Patent No. 4,078,492 Dated March 14, 1978

Inventor(s) Alan D. Levy and Mark A. Seltman

It is certified that error appears in the above-identified patent and that said Letters Patent are hereby corrected as shown below:

Column 2, line 48, after "actual" insert --stained--

Signed and Sealed this

*Twelfth* Day of *September 1978*

[SEAL]

*Attest:*

RUTH C. MASON
*Attesting Officer*

DONALD W. BANNER
*Commissioner of Patents and Trademarks*